Jan. 30, 1962 W. E. TAYLOR ET AL 3,018,539

DIFFUSED BASE TRANSISTOR AND METHOD OF MAKING SAME

Filed Nov. 6, 1956

INVENTORS.
William E. Taylor,
Clement J. Kevane,
By Mueller & Aichele
Att'ys.

United States Patent Office 3,018,539
Patented Jan. 30, 1962

3,018,539

DIFFUSED BASE TRANSISTOR AND METHOD OF MAKING SAME

William E. Taylor and Clement J. Kevane, Phoenix, Ariz., assignors to Motorola, Inc., Chicago, Ill., a corporation of Illinois Filed Nov. 6, 1956, Ser. No. 620,673
2 Claims. (Cl. 29—25.3)

The present invention relates to diffused base semiconductor devices and methods of making the same, and more particularly diffused base power transistors having thin, vapor-plated alloy junction emitter electrodes and methods of making the same.

Thin planar base layers of transistors are highly desirable in all forms of transistors in order to reduce transit time and lessen base resistance. Until the discovery of diffused base transistors, it was very difficult to provide thin planar base layers in transistors and still keep the mechanical strength of the dice high. The three most widely used methods of making transistors have been the grown junction method, the alloy junction method, and the jet-etch-plate method. In the grown junction method, it is difficult to get planar and thin base layers. In the alloy junction method, pellets or discs of electrode metal are placed against opposite sides of a semiconductor die and are alloyed or fused to the die to leave a base layer therebetween. Excellent low frequency transistors are made by this method, but the method is not so economical as is desired in producing high frequency transistors. Alloy junction methods with pellets or discs are not adaptable to forming electrodes on thin diffused base layers because of excessive penetration inherent therein.

With the jet-etch-plate method used with diffused base dice, excellent high frequency transistors are made. However, the jet-etch-plate method is not so economical as is desired and does not lend itself so readily to mass production techniques as is desired. Also, the jet-etch-plate methods are not suitable in the present state of the art for forming large area electrodes as are required for high power transistors. Other needs of the transistor art prior to this invention have been economical, highly reproducible, diffused base power transistors.

An object of the invention is to provide new and improved diffused base semiconductor devices and methods of making the same.

Another object of the invention is to provide diffused base power transistors having a thin, vapor-plated alloy junction emitter electrode and a method of making the same.

A further object of the invention is to provide methods of producing a diffused base power transistor economically.

One feature of the invention is the provision of diffused base power transistors having a thin uniform emitter electrode and a method of making the same.

Another feature of the invention is the provision of diffused base power transistors with large area emitter and collector electrodes and methods of making the same.

Another feature of the process of the invention is the provision of a power semiconductor device having a rectifying electrode on a diffused base layer of a semiconductor die, which contact is formed by vacuum metallizing and alloying a metal plate which is very thin so as to limit the penetration of the electrode and to assure that it does not extend through the diffused layer.

Figures 1, 2, 3, 4, 5:
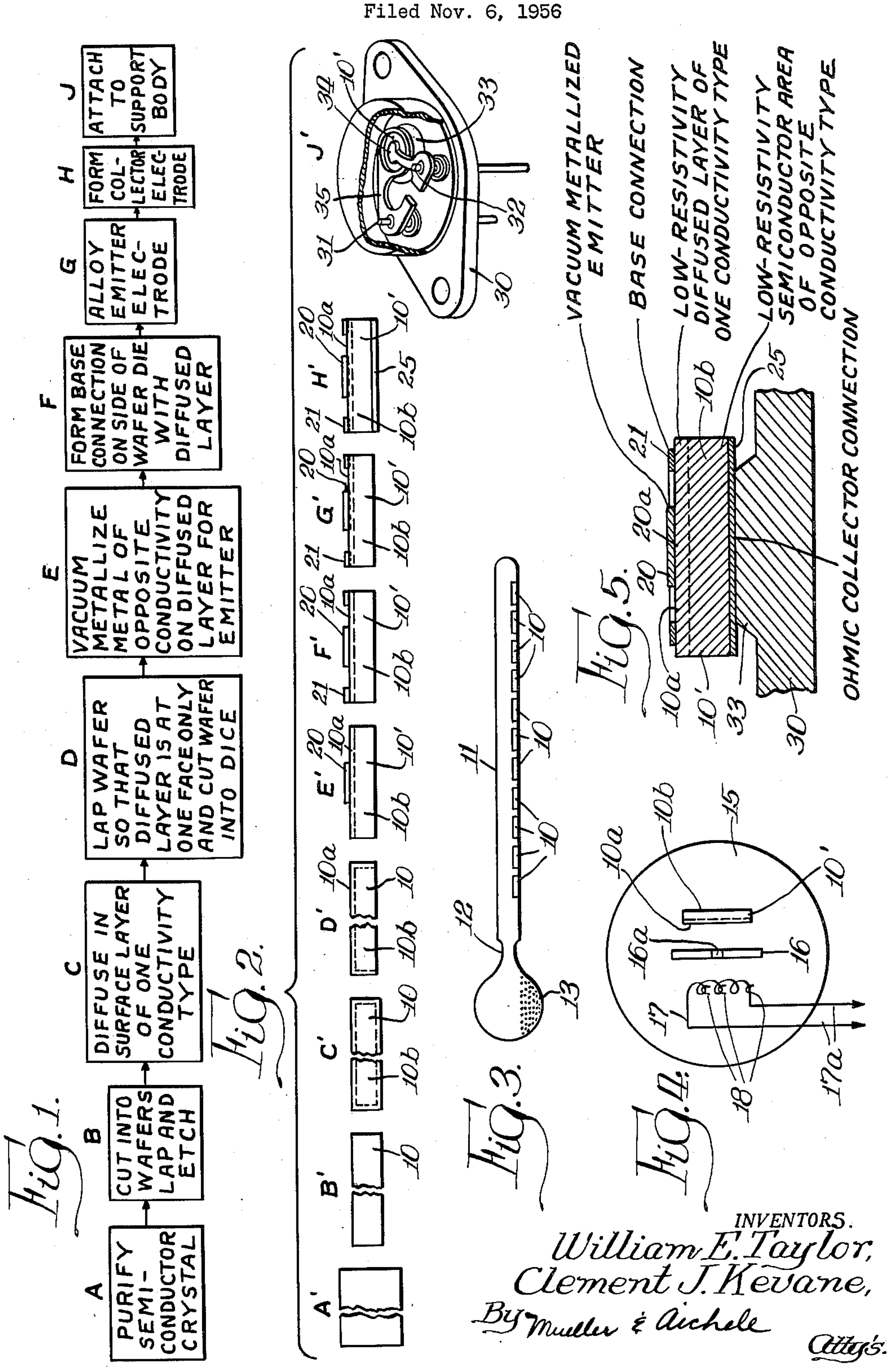
FIG. 1 shows schematically the various steps included in a process forming one embodiment of the invention.
FIG. 2 is a schematic representation of a semiconductor wafer undergoing the steps shown in FIG. 1.
FIG. 3 is a schematic representation of apparatus that is used in producing diffused regions in the semiconductor wafer.
FIG. 4 shows schematically vacuum metallizing equipment that can be used in the process of the invention.
FIG. 5 is a sectional view of a semiconductor device forming one embodiment of the invention.

The invention is directed to a semiconductor device and a method of forming the device which comprises providing a semiconductor crystal wafer of relatively low resistivity, having a diffused base layer. This provides in the crystal a substrate of relatively low resistivity at one face thereof and an adjacent diffused region of relatively low resistivity and of a selected conductivity type at the other face thereof. The wafer is then cut into dice, and an impurity metal is then vacuum metallized onto a large area of the other face of the crystal wafer in rectifying contact with the diffused region and is alloyed thereto. Then an electrode is formed on the entire first face.

In practicing the invention, it is necessary to provide thin semiconductor wafers 10 composed of semiconductor material of a selected conductivity type and of relatively low resistivity. The semiconductor material may be of silicon or germanium and is germanium in the example being described. Also the conductivity type in this example is p-type. Such a wafer is shown in FIG. 2B′ and may be obtained by purifying the block of semiconductor crystal such as germanium in FIG. 2A′ and in accordance with step A of FIG. 1. This purification may be conveniently carried out by the zone-purifying process described by Pfann on page 747 of the July 1952 edition of the Transactions of the American Institute of Metallurgical Engineers, Journal of Metals, in an article entitled, "Principles of Zone Melting." The purified crystal block of p-type germanium is then cut into wafers (step 1B) by any known process. It is desirable, but not essential, that these wafers be formed to have their opposite faces parallel to the Miller (111) crystallographic planes.

The faces of the wafered crystals are then mechanically lapped or otherwise ground by any known process. After lapping, the wafers are etch-cleaned to have a final thickness of, for example, .010″. This etching may use any suitable etching solution such as:

| | Cc. |
|---|---|
| 70% (by weight) nitric acid ($HNO_3$) | 5 |
| 52% (by weight) hydrofluoric acid (HF) | 5 |
| Distilled water | 1 |

A thin, diffused base or graded base layer **10*a* of n-type conductivity is then formed over all the surfaces of the crystal wafer 10 (step 1C). This surface layer is represented in FIG. 2C′ by the region of the semiconductor crystal between the dashed line and the surfaces thereof. This surface layer may be conveniently formed by known methods as by the open tube method of diffusion or by placing the p-type conductivity germanium wafers 10 in a glass tube 11 (FIG. 3). The tube is connected through a restricted portion 12 to an enlarged bulb 13. Powdered germanium which has been doped with antimony, for example, and of a concentration of the order of $1.9\times10^{-3}$ grams of antimony/gram of germanium is placed in the bulb 13. The assembly is then placed in a suitable oven and heated for about three hours at 800° C. This causes the antimony in the bulb 13 to vaporize with a desired concentration so that it will diffuse into the germanium wafers 10 to form the surface layer 10*a*. After about three hours has elapsed, the oven is cooled slowly to 500° C., and the wafers are annealed at this temperature for 48 hours. Known techniques are used in the process to provide a sharply decreasing concentration gradient of the impurity from the outer surface of the wafer inwardly. This diffusion process produces an n-type surface layer, and any suitable element from the nitrogen group in the periodic table can be used for this purpose. Also, if it is desired to produce a diffused p-type surface layer as when the wafer 10** is of n-type conductivity the vapor of a suitable element from column III can be used.

In accordance with step D of FIG. 1 and as shown in FIG. 2D′, the wafer 10 is then lapped to expose a substrate **10*b* so that the diffused layer 10*a* appears only at one face thereof. Then the wafer is cut into dice 10′: which are shown as circular but may be rectangular, each die 10′ being of about 0.250″ in diameter in the example shown. A thin rectifying electrode 20 is then deposited on the face of the diffused base layer 10*a* by vacuum metallizing thereon a p-type meal in contact with the diffused layer 10*a*. For example, aluminum can be used since it constitutes a p-type impurity metal for the germanium which is opposite to the n-type diffused layer in the particular example presently being described. The electrode 20** is extremely thin, preferably being of a thickness of the order of $10^{-5}$″.

Aluminum can be vacuum metallized onto the face of the crystal by use of the apparatus shown schematically in FIG. 4, and a known process. In that FIGURE, the crystal die 10′ is supported in a vacuum chamber 15 with its face adjacent the diffused region **10*a* facing a shield 16, which shield is also supported in the chamber by any appropriate mounting means and which has a central aperture 16*a* therein. A heating coil 17 is mounted in the chamber and has leads 17*a* which extend to a suitable energizing source. Small strips 18 of aluminum are hung onto the coils of heating element 17. When the chamber is evacuated and electrical current is passed through coil 17 to heat and vaporize the aluminum strips 18, the resulting aluminum vapor passes through the aperture 16*a* and is deposited on the face of the die 10′. This provides the electrode 20 shown in FIG. 2E′. It has been found that the electrode 20 actually establishes a rectifying contact with the base layer 10*a*, and can be used without alloying to constitute the emitter electrode of the transistor but preferably is alloyed to the base layer 10*a*** in order to stabilize the electrode.

A base connection 21 is made ohmically to the face of the die 10′ adjacent to the diffused region **10*a*, and may be annular in shape to extend around the periphery of the upper face of the die 10′ and surrounding the emitter 20. This base connection can be made of an impurity metal, such as tin-lead-antimony having the same n-type conductivity characteristics as the diffused region to form an ohmic contact therewith, and it also can be vacuum metallized by using an appropriate shield and by replacing the aluminum strips 18 on heater 17** with strips of the n-type material.

The unit of FIG. 2G′ may then be placed in an alloying furnace which heats the emitter 20 and base 21 and causes them to be alloyed with the diffused region **10*a* of wafer 10. This alloying improves the rectifying contact of the emitter and stabilizes the assembly. It is imperative, of course, that the alloy region adjacent to the emitter does not extend too far into or through the diffused layer 10*a*, and this also applies to the fused regions adjacent the base connection 21. By the use of vacuum metallized electrodes and subsequent alloying, extremely thin alloyed regions can be obtained so that the penetration is very slight and can be accurately controlled. The alloying can be carried out in an argon or other inert atmosphere at (for example) 550° C. for five minutes. Alternatively the die 10′** can be heated while the metal is being vapor deposited to obtain simultaneous alloying.

A collector electrode 25 may now be formed on the entire other face of the die 10′ (step 1H) to produce a die assembly consisting of the die 10′ and the electrodes 20, 21, and 25. The collector electrode is made by vapor deposition as is the emitter electrode. While the vapor-plating of the electrodes has been described as taking place on the die, it is to be understood that a multiple vapor-plating operation can be effected simultaneously on each wafer 10 to provide the electrodes with or without alloying before dicing of the wafer is accomplished. Since the undiffused portion or substrate **10*b*** of the die is of p-type conductivity, the collector electrode need not be alloyed to the die but forms merely an ohmic contact with the substrate.

As a final step 1J, and as shown in FIG. 2J′, the die assembly is mounted on a metal mounting base 30 which has rigid feed-thrus 31 and 32 extending therethrough and insulated one from another. The die assembly is mounted on a pedestal 33 of the base by fusing the collector electrode 25 to the pedestal. The mounting base is massive to provide high heat conductivity, and preferably is composed of copper having a layer of silver covered by a thin layer of gold on the surfaces thereof to facilitate soldering thereto. The feed-thrus are soldered to the base 30 and suitable leads 34 and 35 are attached to the emitter electrode 20 and base connection 21 respectively, and these leads are then connected to the respective feed-thrus 31 and 32. The resulting transistor can then be sealed in any suitable manner and passed on to the final test. Prior to sealing, any suitable etching or cleaning operation can be made on the unit.

The resulting transistor die 10′ therefore, has a substrate **10*b* of low resistivity, defined herein as less than about 5 ohm-centimeters, and p-type conductivity and it has a diffused base layer 10*a* adjacent thereto having a low resistivity and which is diffused into the transistor in the manner described above. The substrate forms one face of the die and the base layer forms the other face. In accordance with the process of the invention, the emitter electrode 20 is formed adjacent to the diffused base layer 10*a* by vacuum-metallizing which assures a good rectifying connection with negligible penetration into the die. Further alloying of this electrode assures stability and improves the rectifying contact without resulting in excessive penetration. It should be clear that this alloying can be carried out at the same time that the collector electrode 25** is formed.

The specifically described transistor is suitable for high power operation. The collector electrode 25 being vacuum metallized over the entire face of the die 10′ opposite to the emitter electrode 20 and fits to the top of the pedestal 33 of a in face-to-face contact therewith to provide an excellent thermal path to carry away the heat from the substrate **10*b*. The vacuum-metallized collector electrode is soldered to the pedestal 33**, which not only provides an electrical connection to the collector electrode but also conducts away heat therefrom to a heat sink to maintain the collector junction relatively cool so as to permit high power operations. It is usual for the transistor to be used in a grounded collector circuit so that the collector heat sink connection can be mounted directly on the chassis of the apparatus with which it is used so that the chassis may provide a further path for conducting away the heat from the collector junction.

In the preceding embodiment of the invention, the die 10′ has been described as being of p-type conductivity and the diffused base layer to be of n-type conductivity. However, the crystal die 10′ may be in its original form a low resistivity semiconductor of n-type conductivity and the diffused base layer of p-type conductivity. In the latter instance, the emitter electrode 20 is of an n-type metal as tin-lead-antimony and the collector is also of n-type conductivity metal. The base electrode is ohmic and of a p-type metal such as tin or aluminum, the p-n collector junction being formed between the substrate of n-type conductivity and the diffused region. The transistor shown is a high power transistor designed to have a power output of several watts.

In one example, the die 10' is germanium and the resistivity of the substrate **10*b* of the die is about 4 to 5 ohm-centimeters and is of p-type conductivity. The graded base layer 10*a* is of n-type conductivity and is about 0.001" thick, and the thickness of the undiffused collector layer or substrate 10*b* should be from about 0.003" to about 0.007", in one example being of the order of about 0.007". The diameter of the plated and alloyed emitter electrode is about 0.125" and the diameter of the collector electrode is of the order of 0.25". The pedestal 33 has a diameter of slightly less than 0.25" so that a very large area of contact between the substrate 10*b* and the mounting base 30 is provided to give excellent heat transfer from the substrate to the mounting base. This transfer is also aided by the thinness of the collector electrode which is in direct contact with the pedestal. The penetration of the alloyed area 20*a*** is planar and of a thickness of less than 0.0005". The resulting transistor is very rugged, has precisely spaced electrodes, and is economical to manufacture. It has a power output of several watts. In addition, the operating characteristics are excellent.

In the transistor described above, the die 10' is mounted directly on the pedestal 33 being separated by only a very thin heat-conductive metallic layer so that the die 10' is cooled very effectively by the mounting base and the heat sink to which the mounting base is affixed.

We claim:

1. A method of forming a rectifying contact and an ohmic contact which are each of accurately controlled size, configuration and position on one face of a semiconductor crystal element which has a rectifying junction therein displaced from said face of such crystal element a micrometric depth, said method including placing said crystal element in vacuum evaporation apparatus, vapor depositing a predetermined amount of rectifying-junction-forming impurity material on to a predetermined portion of said face of said crystal element by projecting such impurity material through an apertured mask which defines the resulting deposit on said crystal element as to area, configuration and position, vapor depositing a predetermined amount of ohmic-contact-forming metallic material on to another predetermined portion of said face of said crystal element by projecting such metallic material through an apertured mask which defines the resulting deposit on said crystal element as to area, configuration and position, said vapor depositings being accomplished in a selected sequence with said crystal element remaining in said vacuum evaporation apparatus until both of said vapor depositings are completed, physically removing said crystal element with said deposits thereon from said vacuum evaporation apparatus upon completion of said vapor depositings, and subsequently alloying both of said deposits with said crystal element in a single alloying operation by placing said crystal element in an alloying apparatus and in a heated region thereof which is maintained at a selected temperature sufficient to cause alloying of said deposit of impurity material and said deposit of metallic material with said crystal element to a controlled depth measured from said face of said crystal element that is less than the depth of the rectifying junction which initially existed in said crystal element.

2. A method of forming a thin base region in a semiconductor crystal element and a collector junction at the innermost portion of the base region which junction is displaced from a face of the crystal element a micrometric depth, and of further forming an emitter connection and a base connection to said base region, which said connections are accurately defined as to size, configuration and position and whose penetration into such crystal element from said face thereof is limited to a depth less than the depth of said collector junction from said face, said method including vapor-diffusing a first impurity material into said crystal element so as to form a thin diffused base region at said face of said element and inwardly thereof and a rectifying collector junction at the innermost portion of said diffused base region, vapor depositing a predetermined amount of a second impurity material on to a predetermined portion of said face of said crystal element by projecting such impurity material through an apertured mask which defines the resulting deposit on said crystal element as to area, configuration and position, vapor depositing a predetermined amount of ohmic-contact-forming metallic material on to another predetermined portion of said face of said crystal element by projecting such metallic material through an apertured mask which defines the resulting deposit on said crystal element as to area, configuration and position, said vapor depositings being accomplished in a selected sequence with said crystal element remaining in said vacuum evaporation apparatus until both of said vapor depositings are completed, physically removing said crystal element with said deposits thereon from said vacuum evaporation apparatus upon completion of said vapor depositings, and subsequently alloying both of said deposits with said crystal element in a single alloying operation by placing said crystal element in an alloying apparatus and in a heated region thereof which is maintained at a selected temperature sufficient to cause alloying of said deposit of impurity material and said deposit of metallic material with said crystal element to a controlled depth measured from said face of said crystal element that is less than said depth of said collector junction.

References Cited in the file of this patent

UNITED STATES PATENTS

| | | |
|---|---|---|
| 2,561,411 | Pfann | July 24, 1951 |
| 2,672,528 | Shockley | Mar. 16, 1954 |
| 2,709,232 | Thedieck | May 24, 1955 |
| 2,725,505 | Webster et al. | Nov. 29, 1955 |
| 2,730,663 | Harty | Jan. 10, 1956 |
| 2,757,323 | Jordan et al. | July 31, 1956 |
| 2,810,870 | Hunter et al. | Oct. 22, 1957 |
| 2,829,422 | Fuller | Apr. 8, 1958 |
| 2,842,668 | Rutz | July 8, 1958 |
| 2,842,831 | Pfann | July 15, 1958 |
| 2,922,935 | Dolder | Jan. 26, 1960 |
| 2,924,760 | Herlet | Feb. 9, 1960 |